(12) United States Patent
Tong et al.

(10) Patent No.: US 11,302,678 B2
(45) Date of Patent: Apr. 12, 2022

(54) LIGHT-EMITTING PACKAGE STRUCTURE

(71) Applicant: Lextar Electronics Corporation, Hsinchu (TW)

(72) Inventors: Hung-Chun Tong, Hsinchu (TW); Fu-Hsin Chen, Hsinchu (TW); Wen-Wan Tai, Hsinchu (TW); Yu-Chun Lee, Hsinchu (TW); Tzong-Liang Tsai, Hsinchu (TW)

(73) Assignee: Lextar Electronics Corporation, Hsinchu (TW)

( * ) Notice: Subject to any disclaimer, the term of this patent is extended or adjusted under 35 U.S.C. 154(b) by 0 days.

(21) Appl. No.: 16/699,091

(22) Filed: Nov. 28, 2019

(65) Prior Publication Data

US 2021/0143133 A1 May 13, 2021

(30) Foreign Application Priority Data

Nov. 13, 2019 (TW) ................................ 108141271

(51) Int. Cl.
| | | |
|---|---|---|
| *H01L 25/075* | (2006.01) | |
| *H01L 33/58* | (2010.01) | |
| *H01L 33/52* | (2010.01) | |
| *H01L 33/50* | (2010.01) | |

(52) U.S. Cl.
CPC .......... *H01L 25/0753* (2013.01); *H01L 33/52* (2013.01); *H01L 33/58* (2013.01); *H01L 33/507* (2013.01); *H01L 2933/0041* (2013.01); *H01L 2933/0058* (2013.01); *H01L 2933/0091* (2013.01)

(58) Field of Classification Search
CPC ........................ H01L 33/52; H01L 2933/0041
See application file for complete search history.

(56) References Cited

U.S. PATENT DOCUMENTS

| | | | | |
|---|---|---|---|---|
| 2012/0236582 | A1* | 9/2012 | Waragaya | H01L 33/60 362/510 |
| 2014/0145610 | A1* | 5/2014 | Rode | H01L 41/107 315/70 |
| 2015/0001563 | A1* | 1/2015 | Miki | H01L 33/54 257/98 |
| 2015/0003038 | A1 | 1/2015 | Liu et al. | |
| 2015/0099320 | A1 | 4/2015 | Cheng | |
| 2016/0148916 | A1 | 5/2016 | Higginson et al. | |
| 2018/0069162 | A1* | 3/2018 | Abe | H01L 33/56 |

(Continued)

*Primary Examiner* — Jay C Chang
*Assistant Examiner* — Mikka Liu
(74) *Attorney, Agent, or Firm* — CKC & Partners Co., LLC

(57) ABSTRACT

A light-emitting package structure includes a light transmissive adhesive layer, a substrate, and at least one light-emitting diode chip. The light transmissive adhesive layer includes a first surface and a second surface facing away from the first surface. The substrate is on the first surface of the light transmissive adhesive layer. The light-emitting diode chip is on the second surface of the light transmissive adhesive layer. The light transmissive adhesive layer has a first portion and a second portion on the second surface, the first portion surrounds the second portion, a vertical projection area of the second portion on the substrate at least entirely covers a vertical projection area of the light-emitting diode chip on the substrate, and a thickness of the second portion is smaller than or equal to a thickness of the first portion.

8 Claims, 12 Drawing Sheets

(56) References Cited

U.S. PATENT DOCUMENTS

| | | |
|---|---|---|
| 2018/0269234 A1 | 9/2018 | Hughes et al. |
| 2019/0296198 A1 | 9/2019 | Chen et al. |
| 2020/0083414 A1* | 3/2020 | Tomonari ................ H01L 33/54 |

* cited by examiner

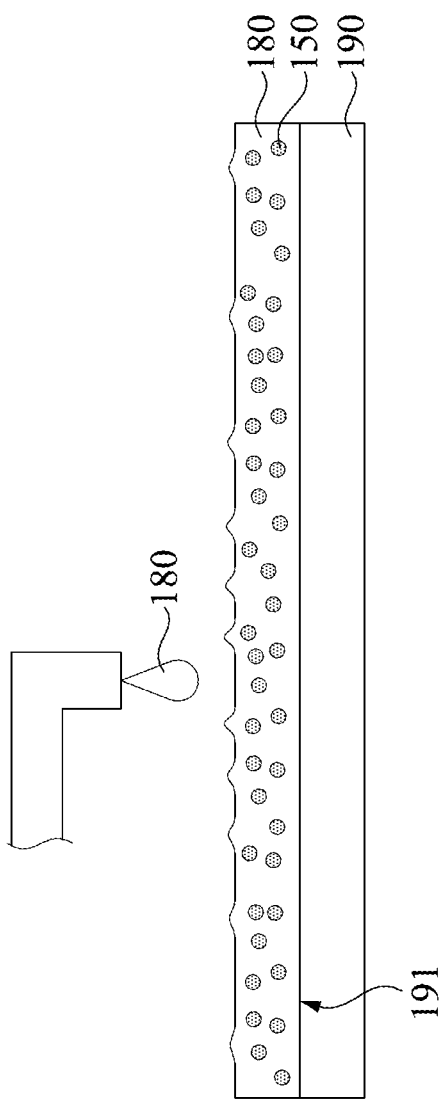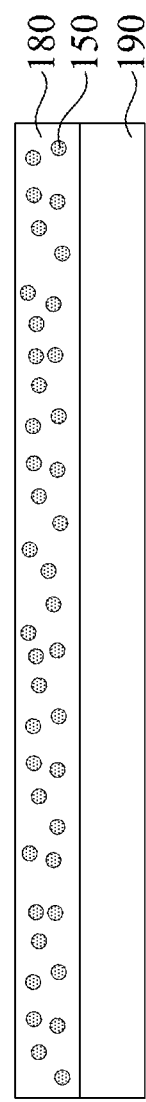
Fig. 6
Fig. 7

LIGHT-EMITTING PACKAGE STRUCTURE

RELATED APPLICATIONS

This application claims priority to Taiwan Application Serial Number 108141271, filed Nov. 13, 2019, which is herein incorporated by reference.

BACKGROUND

Field of Invention

The present disclosure relates to a light-emitting package structure and a method of manufacturing the light-emitting package structure.

Description of Related Art

Light-emitting diodes (LEDs) are widely used in illuminating, backlights, and light-emitting diode displays because of their long life, low power consumption, and simple driving. In general, a light-emitting diode display often uses a red, green, and blue light-emitting diode chips as a pixel, and the pixels are arranged to form a full-color light-emitting diode display.

However, such a light-emitting diode display often faces problems such as uneven illumination, electrical controlling difficulties, inability to reduce size, and high manufacturing cost. Therefore, how to effectively solve the above problems is an urgent issue to be resolved.

SUMMARY

The disclosure relates in general to a light-emitting package structure and a manufacturing method thereof.

According to an embodiment of the present disclosure, the light-emitting package structure includes a light transmissive adhesive layer, a substrate, and at least one light-emitting diode chip. The light transmissive adhesive layer includes a first surface and a second surface facing away from the first surface. The substrate is on the first surface of the light transmissive adhesive layer. The light-emitting diode chip is on the second surface of the light transmissive adhesive layer. The light transmissive adhesive layer has a first portion and a second portion on the second surface, the first portion surrounds the second portion, a vertical projection area of the second portion on the substrate at least entirely covers a vertical projection area of the light-emitting diode chip on the substrate, and a thickness of the second portion is smaller than or equal to a thickness of the first portion.

In an embodiment of the present disclosure, an oblique surface is between the second surface of the first portion and the second surface of the second portion, and the oblique surface gradually extends away the light emitting-diode chip from the second surface of the second portion to the second surface of the first portion.

In an embodiment of the present disclosure, a height of a climbing of the first portion of the light transmissive adhesive layer is smaller than 20% of a height of the light-emitting diode chip.

In an embodiment of the present disclosure, a number of the light-emitting diode chip is plural.

In an embodiment of the present disclosure, each of the light-emitting diode chips includes a red light-emitting diode chip, a green light-emitting diode chip or a blue light-emitting diode chip.

In an embodiment of the present disclosure, light-emitting package further includes a plurality of filler particles in the light transmissive adhesive layer, in which the filler particles are configured to adjust a path of light emitted by the light-emitting diode chip.

In an embodiment of the present disclosure, the light-emitting diode chip emits blue light, the light-emitting package structure further includes a wavelength converting substance in the light transmissive adhesive layer, and the wavelength converting substance absorbs portions of the blue light and converts to corresponding color light.

In an embodiment of the present disclosure, the substrate is a light transmissive substrate.

In an embodiment of the present disclosure, light-emitting package structure further includes an encapsulation layer on the second surface of the light transmissive adhesive layer and covering the light-emitting diode chip.

According to an embodiment of the present disclosure, the method of manufacturing the light-emitting package structure includes: forming a light transmissive adhesive material on a carrier; heating the light transmissive adhesive material, in which a maximum of a rheological loss factor $(\tan \delta)_{max}$ of the light transmissive adhesive material is in a range from 0.5 to 2.5; transferring the light transmissive adhesive material from the carrier to a substrate; disposing at least one light-emitting diode chip on the light transmissive adhesive material; and heating the light transmissive adhesive material to form a light transmissive adhesive layer, such that the light-emitting diode chip is fixed onto the light transmissive adhesive layer.

In an embodiment of the present disclosure, heating the light transmissive adhesive material is performed under a maximum temperature in a range from about 110° C. to about 150° C.

In an embodiment of the present disclosure, heating the light transmissive adhesive material to form the light transmissive adhesive layer is performed under a temperature in a range from about 80° C. to about 160° C.

In an embodiment of the present disclosure, transferring the light transmissive adhesive material from the carrier to the substrate includes: disposing the light transmissive adhesive material to the substrate, such that the substrate and the carrier are respectively on opposite surfaces of the light transmissive adhesive material; heating and pressurizing the carrier, the light transmissive adhesive material, and the substrate; and utilizing a difference between an adhesion force between the light transmissive adhesive material and the carrier and an adhesion force between the light transmissive adhesive material and the substrate, such that the light transmissive adhesive material is detached from the carrier and adhered to the substrate.

In an embodiment of the present disclosure, the light transmissive adhesive layer has a first portion and a second portion, the first portion surrounds the second portion, a vertical projection area of the second portion on the substrate at least entirely covers a vertical projection area of the light-emitting diode chip on the substrate, and a thickness of the second portion is smaller than or equal to a thickness of the first portion.

In an embodiment of the present disclosure, the method of manufacturing the light-emitting package structure further includes: doping a plurality of filler particles or a wavelength converting substance into the light transmissive adhesive material before forming the light transmissive adhesive material on the carrier.

In the aforementioned embodiments of the present disclosure, during the manufacturing process of the light-emitting package structure, the light transmissive adhesive material is first heated to be in a semi-solid colloidal state, and since the maximum of the rheological loss factor (tan $\delta)_{max}$ of the light transmissive adhesive material is in a range from 0.5 to 2.5, fluidity of the light transmissive adhesive material can be appropriate. As such, the climbing of the light transmissive adhesive material will not obviously occur when the light-emitting diode chip is being disposed thereon, and a displacement of the light-emitting diode chip will not obviously occur during the disposing of the light-emitting diode chip, neither. Therefore, the light-emitting diode chip is effectively fixed onto the substrate through the subsequently formed light transmissive adhesive layer, and hence the yield of the light-emitting package structure is improved. Furthermore, the light transmissive adhesive layer of the light-emitting package structure formed by the aforementioned manufacturing method may have the first portion and the second portion surrounded by the first portion, in which the light-emitting diode chip is disposed on the second portion, and the thickness of the second portion is smaller than or equal to the thickness of the first portion.

BRIEF DESCRIPTION OF THE DRAWINGS

The disclosure can be more fully understood by reading the following detailed description of the embodiments, with reference made to the accompanying drawings as follows:

FIGS. 6-11 are schematic diagrams of a process at various stages of a method of manufacturing a light-emitting package structure according to an embodiment of the present disclosure.

DETAILED DESCRIPTION

Figure 1:
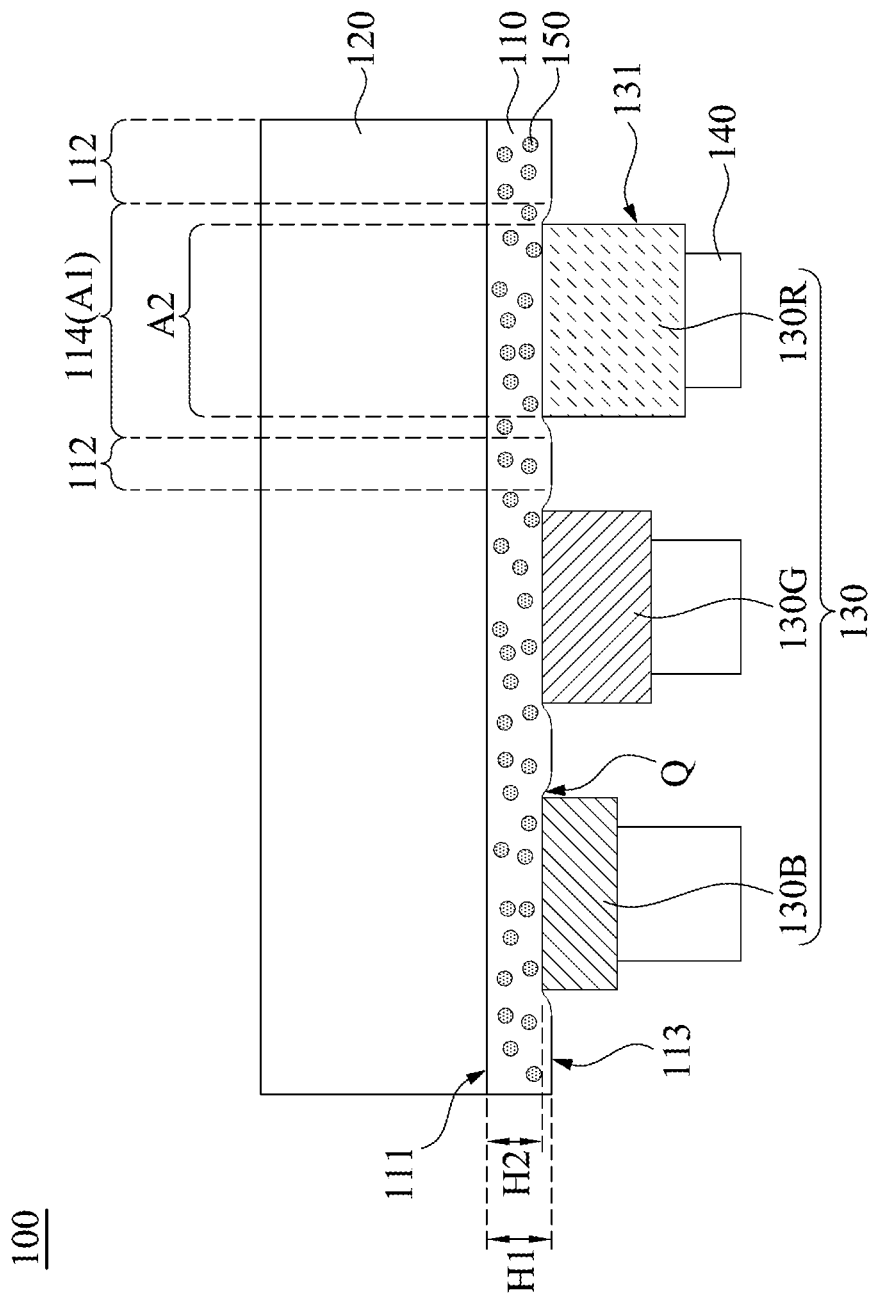
FIG. 1 is a side view of a light-emitting package structure according to an embodiment of the present disclosure.

Reference will now be made in detail to the present embodiments of the disclosure, examples of which are illustrated in the accompanying drawings. Wherever possible, the same reference numbers are used in the drawings and the description to refer to the same or like parts.

FIG. 1 is a side view of a light-emitting package structure 100 according to an embodiment of the present disclosure. The light-emitting package structure 100 includes a light transmissive adhesive layer 110, a substrate 120, and at least one light-emitting diode chip 130. The light transmissive adhesive layer 110 has a first surface 111 and a second surface 113 facing away from the first surface 111. The substrate 120 is on the first surface 111 of the light transmissive adhesive layer 110, and the light-emitting diode chip 130 is on the second surface 113 of the light transmissive adhesive layer 110. In some embodiments, the substrate 120 is a light transmissive substrate, such as a sapphire substrate, a glass substrate, a transparent conductive substrate or a light transmissive substrate including conductive traces. Furthermore, the light-emitting package structure 100 further includes a conductive pad 140, and the conductive pad 140 may be on a surface of the light-emitting diode chip 130 facing away from the light transmissive adhesive layer 110 to provide an electrical connecting function.

In some embodiments, a number of the light-emitting diode chip 130 may be plural, for example, the light-emitting diode chips 130 include a red light-emitting diode chip 130R, a green light-emitting diode chip 130G, a blue light-emitting diode chip 130B, or the like. For example, as shown in FIG. 1, the light-emitting package structure 100 may include a pixel unit formed by the adjacently arranged red light-emitting diode chip 130R, green light-emitting diode chip 130G, and blue light-emitting diode chip 130B.

When the light-emitting diode chip 130 generates light of a corresponding wavelength, the light sequentially passes through the light transmissive adhesive layer 110 and the substrate 120, and exits from the substrate 120. The substrate 120 is a light transmissive substrate, and the light transmissive adhesive layer 110 is made of a light transmissive adhesive material. The light transmissive adhesive material includes any light transmissive polymer material, such that the transmission of light is not being affected, and hence the optical quality of the light-emitting package structure 100 is maintained. The aforementioned light transmissive polymer material may include poly(methyl methacrylate) (PMMA), polyethylene terephthalate (PET), polyethylene naphthalate (PEN), polystyrene (PS), polypropylene (PP), polyamide (PA), polycarboxylate (PC), polyimide (PI), epoxy, silicone, polydimethylsiloxane (PDMS), or combinations thereof, but the present disclosure is not limited in this regard.

In some embodiments, the light-emitting package structure 100 further includes a plurality of filler particles 150 in the light transmissive adhesive layer 110. The filler particles 150 are configured to adjust a path of the light emitted by the light-emitting diode chip 130. The filler particles 150 may be made of a material including titanium dioxide ($TiO_2$), silicon oxide ($SiO_2$), aluminum oxide ($Al_2O_3$), boron nitride (BN), zinc oxide (ZnO), or combinations thereof. By doping the aforementioned filler particles 150 of different materials and sizes, the path of the light is adjusted to meet the needs of designer.

In some embodiments, the light transmissive adhesive layer 110 has a first portion 112 and a second portion 114 on the second surface 113, the first portion 112 surrounds the second portion 114, and the light-emitting diode chip 130 is disposed on the second surface 113 of the second portion 114. In other words, a vertical projection area A1 of the second portion 114 on the substrate 120 at least entirely covers a vertical projection area A2 of the light-emitting diode chip 130 on the substrate 120. In some embodiments, the vertical projection area A1 of the second portion 114 on the substrate 120 is larger than the vertical projection area A2 of the light-emitting diode chip 130 on the substrate 120. In other embodiments, the vertical projection area A1 of the second portion 114 on the substrate 120 entirely overlaps the vertical projection area A2 of the light-emitting diode chip 130 on the substrate 120.

In some embodiments, the disposing of the light-emitting diode chip 130 causes the second portion 114 of the light transmissive adhesive layer 110 to be slightly recessed, such that a thickness H2 of the second portion 114 is smaller than a thickness H1 of the first portion 112, and the first portion 112 surrounds portions of the light-emitting diode chip 130. In this case, an oblique surface Q is between the second surface 113 of the first portion 112 and the second surface 113 of the second portion 114, and the oblique surface Q gradually extends away side surfaces 131 of the light emitting-diode chip 130 from the second surface 113 of the second portion 114 to the second surface 113 of the first portion 112. In other words, the oblique surface Q connects the second surface 113 of the second portion 114 to the second surface 113 of the first portion 112. As a result, the second surface 113 of the second portion 114 of the light transmissive adhesive layer 110 and the oblique surface Q together form an outwardly expanded concave shape, and the oblique surface Q is not in contact with the side surfaces 131 of the light emitting-diode chip 130. In another embodiment, the disposing of the light-emitting diode chip 130 does not cause the second portion 114 of the light transmissive adhesive layer 110 to be slightly recessed, such that the thickness H2 of the second portion 114 is equal to the thickness H1 of the first portion 112. No matter whether the second portion 114 of the light transmissive adhesive layer 110 is recessed or not, the aforementioned first portion 112 of the light transmissive adhesive layer 110 does not climb along the side surfaces 131 of the light emitting-diode chip 130. In addition, the thickness H1 of the first portion 112 of the light transmissive adhesive layer 110 is in a range from about 5 μm to about 50 μm.

In other embodiments, the first portion 112 of the light transmissive adhesive layer 110 slightly climbs along the side surfaces 131 of the light emitting-diode chip 130, and a height of the climbing of the first portion 112 of the light transmissive adhesive layer 110 is smaller than 20% of a height of the light-emitting diode chip 130. In preferred embodiments, the height of the climbing of the first portion 112 of the light transmissive adhesive layer 110 is smaller than 10% of the height of the light-emitting diode chip 130.

Figure 2:
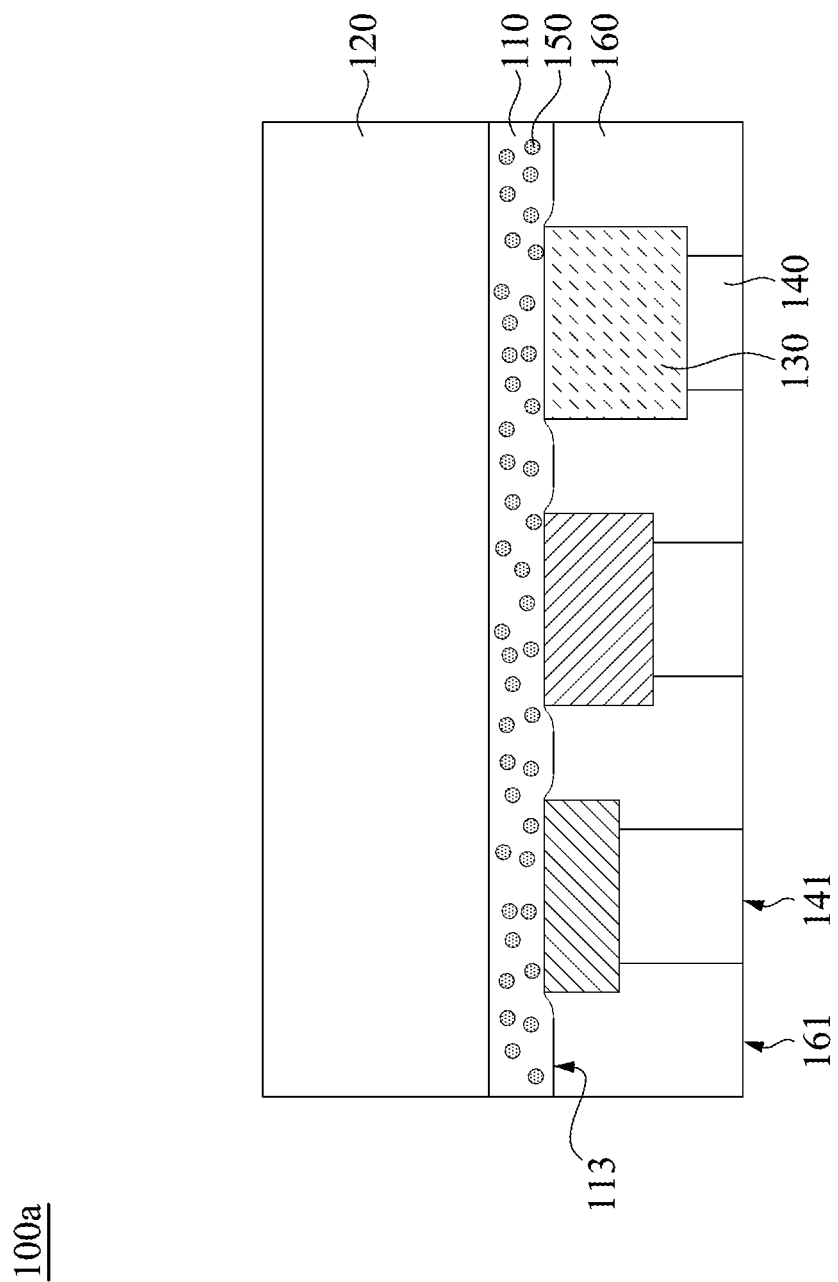
FIG. 2 is a side view of a light-emitting package structure according to another embodiment of the present disclosure.

FIG. 2 is a side view of a light-emitting package structure 100a according to another embodiment of the present disclosure. In some embodiments, the light-emitting package structure 100a further includes an encapsulation layer 160. The encapsulation layer 160 is disposed on the second surface 113 of the light transmissive adhesive layer 110 to cover the light-emitting diode chip 130. In addition, a bottom surface 161 of the encapsulation layer 160 is substantially coplanar with a bottom surface 141 of the conductive pad 140, such that the conductive pad 140 is exposed by the encapsulation layer 160 to provide an electrical connecting function for further electrical connection to external circuits, conductive structures, or the like.

Figure 3:
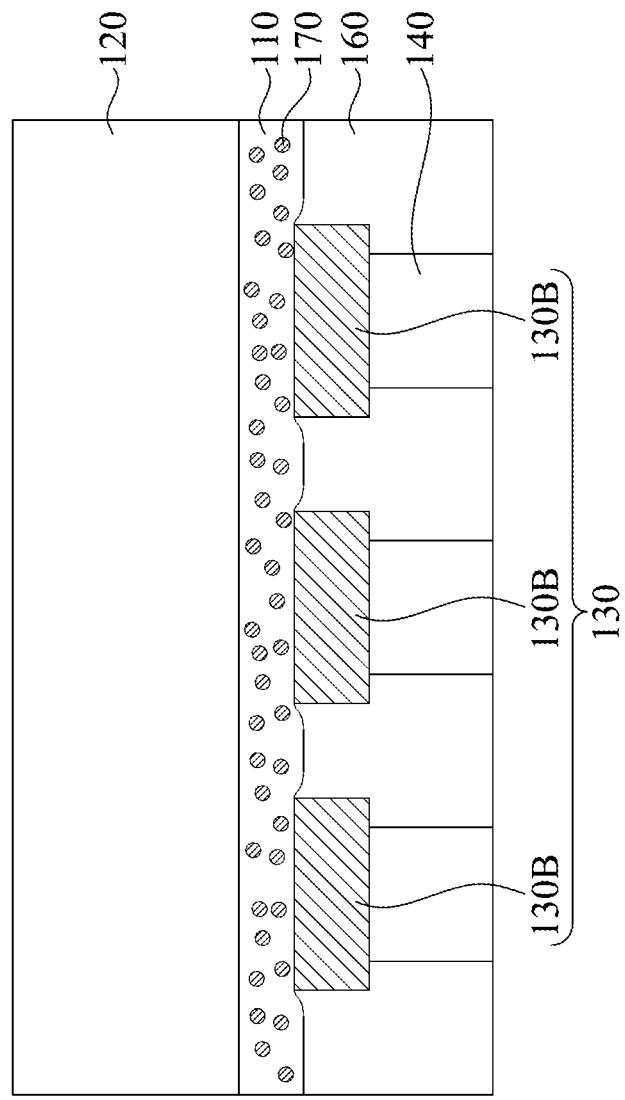
FIG. 3 is a side view of a light-emitting package structure according to another embodiment of the present disclosure.

FIG. 3 is a side view of a light-emitting package structure 100b according to another embodiment of the present disclosure. A difference between the light-emitting package structure 100b of FIG. 3 and the light-emitting package structure 100a of FIG. 2 is that each of the light-emitting diode chips 130 of the light-emitting package structure 100b is a blue light-emitting diode chip 130b. In other words, each of the light-emitting diode chips 130 emits blue light. In some embodiments, the light-emitting package structure 100b further includes a wavelength converting substance 170 in the light transmissive adhesive layer 110. When the blue light emitted by the light-emitting diode chip 130 passes through the light transmissive adhesive layer 110, the wavelength converting substance 170 in the light transmissive adhesive layer 110 can absorb portions of the blue light and convert into color light of a corresponding wavelength (e.g., produce white light by mixing the remained unconverted blue light and the color light). As such, each of the light-emitting diode chips 130 can form white light by the wavelength converting substance 170, such that a light-emitting package structure 100b includes one blue light-emitting diode chip 130B.

In some embodiments, the wavelength converting substance 170 includes organic luminescence materials. For example, the organic luminescence materials include a single molecule, a multi-molecule, an oligomer, a polymer, or combinations thereof having one or more specific functional groups. The aforementioned functional groups include perylene, benzimidazole, naphthalene, anthracene, phenanthrene, fluorine, 9-fluorine, carbazole, glutarimide, 1,3-diphenylbenzene, benzopyrene, pyrene, pyridine, 2,3-dihydro-1h-benzo[de]isoquinoline-1,3-dione, or thiophene.

In some embodiments, the wavelength converting substance 170 includes inorganic luminescence materials. For example, the inorganic luminescence materials include $Y_3Al_5O_{12}$(YAG), LuYAG, GaYAG, $SrS:Eu^{2+}$, $SrGa_2S_4$:$Eu^{2+}$, $ZnS:Cu^+$, $ZnS:Ag^+$, $Y_2O_2S:Eu^{2+}$, $La_2O_2S:Eu^{2+}$, $Gd_2O_2S:Eu^{2+}$, $SrGa_2S_4:Ce^{3+}$, $ZnS:Mn^{2+}$, $SrS:Eu^{2+}$, CaS:$Eu^{2+}$, $(Sr_{1-x}Ca_x)S:Eu^{2+}$, $Ba_2SiO_4:Eu^{2+}$, $Sr_2SiO_4:Eu^{2+}$, $Ca_8Mg(SiO_4)_4Cl_2:Eu^{2+}$, $(Mg,Ca,Sr,Ba)_3Si_2O_7:Eu^{2+}$, $(Mg,Ca,Sr,Ba)_2SiO_4:Eu^{2+}$, $(Sr,Ca,Ba)Si_xO_yN_z:Eu^{2+}$, $Ca_2Si_5N_8$:$Eu^{2+}$, $(Ca,Mg,Y)S$ $Ce^{2+}$, $(Ca,Mg,Y)Si_wAl_xO_yN_z:Eu^{2+}$, $K_2GeF_6:Mn^{4+}$, $K_2SiF_6:Mn^{4+}$, $K_2TiF_6:Mn^{4+}$, $Sr(LiAl_3N_4)$:$Eu^{2+}$, $Si_{6-n}Al_nO_nN_{8-n}$ (n=0-4.2):$Eu^{2+}$, or combinations thereof.

In some embodiments, the wavelength converting substance 170 includes quantum dot materials. For example, the quantum dot materials include CdSe, CdTe, ZnS, ZnSe, ZnTe, ZnO, HgS, HgSe, HgTe, CdSeS, CdSeTe, CdSTe, ZnSeS, ZnSeTe, ZnSTe, HgSeS, HgSeTe, HgSTe, CdZnS, CdZnSe, CdZnTe, CdHgS, CdHgSe, CdHgTe, HgZnS, HgZnSe, HgZnTe, CdZnSeS, CdZnSeTe, CdZnSTe, CdHgSeS, CdHgSeTe, CdHgSTe, HgZnSeS, HgZnSeTe, HgZnSTe, GaN, GaP, GaAs, GaSb, AlN, AlP, AlAs, AlSb, InN, InP, InAs, InSb, GaNP, GaNAs, GaNSb, GaPAs, GaPSb, AlNP, AlNAs, AlNSb, AlPAs, AlPSb, InNP, InNAs, InNSb, InPAs, InPSb, GaAlNP, GaAlNAs, GaAlNSb, GaAlPAs, GaAlPSb, GaInNP, GaInNAs, GaInNSb, GaInPAs, GaInPSb, InAlNP, InAlNAs, InAlNSb, InAlPAs, InAlPSb, SnS, SnSe, SnTe, PbS, PbSe, PbTe, SnSeS, SnSeTe, SnSTe, PbSeS, PbSeTe, PbSTe, SnPbS, SnPbSe, SnPbTe, SnPbSSe, SnPbSeTe, SnPbSTe, $CsPbX_3$, or $Cs_4PbX_6$, in which X is chloride, bromide, iodide, or combinations thereof.

In some embodiments, surfaces of the quantum dot materials can further be subjected to a modification treatment, such as a ligand exchange treatment, a microemulsion treatment, an organic material coating, an inorganic material coating, a mesoporous coating or combinations thereof. The quantum dot materials being subjected to the modification treatment can have a better luminescence lifetime.

It is to be noted that the connection relationships and the advantages of the elements described above will not be repeated. In the following description, a method of manufacturing the light-emitting package structure 100 will be discussed.

Figure 4:
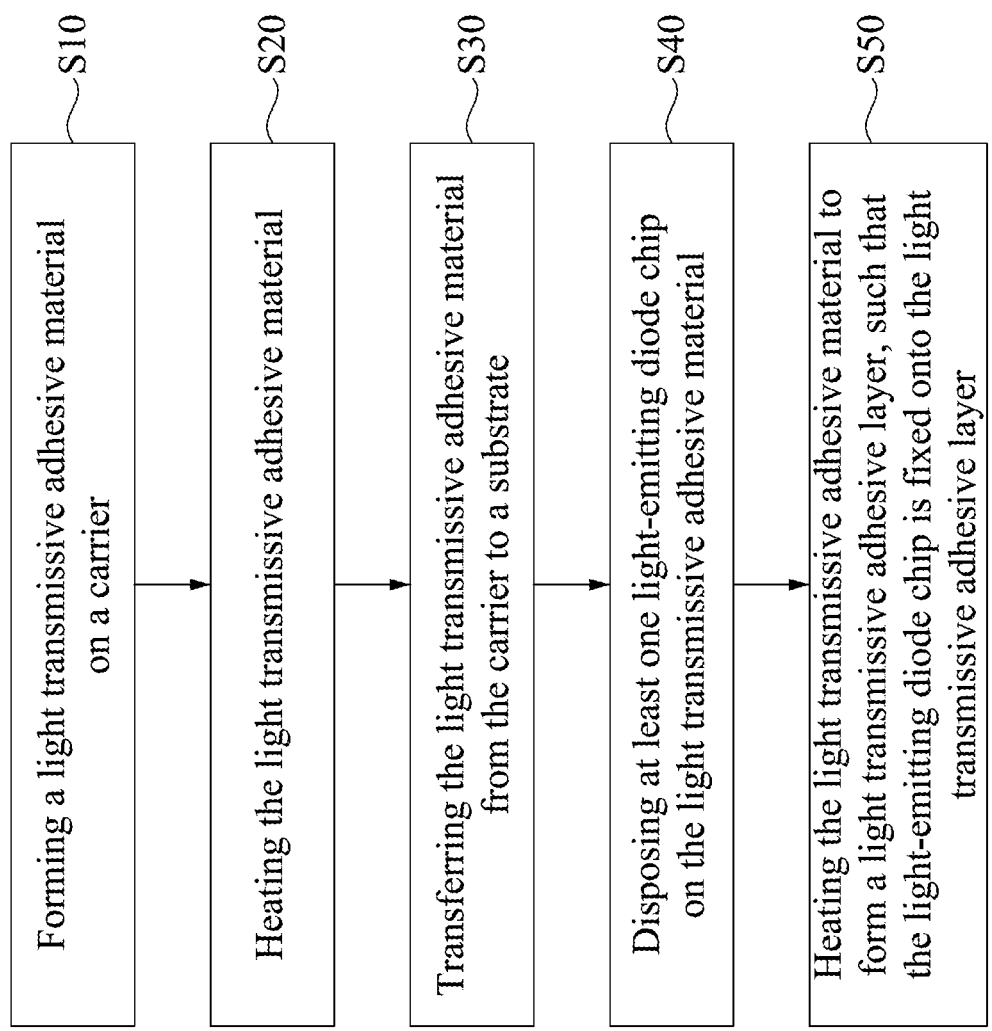
FIG. 4 is a flow diagram of a method of manufacturing a light-emitting package structure according to an embodiment of the present disclosure.

FIG. 4 is a flow diagram of the method of manufacturing the light-emitting package structure 100 according to an embodiment of the present disclosure. The method of manufacturing the light-emitting package structure 100 includes the following steps. In step S10, a light transmissive adhesive material is formed on a carrier. In step S20, the light transmissive adhesive material is heated, in which a maximum of a rheological loss factor (tan $\delta)_{max}$ of the light transmissive adhesive material is in a range from 0.5 to 2.5. In step S30, the light transmissive adhesive material is transferred from the carrier to a substrate. In step S40, at least one light-emitting diode chip is disposed on the light transmissive adhesive material. In step S50, the light transmissive adhesive material is heated to form a light transmissive adhesive layer, such that the light-emitting diode chip is fixed onto the light transmissive adhesive layer. In the following descriptions, the aforementioned steps will be further discussed.

Figure 5A:
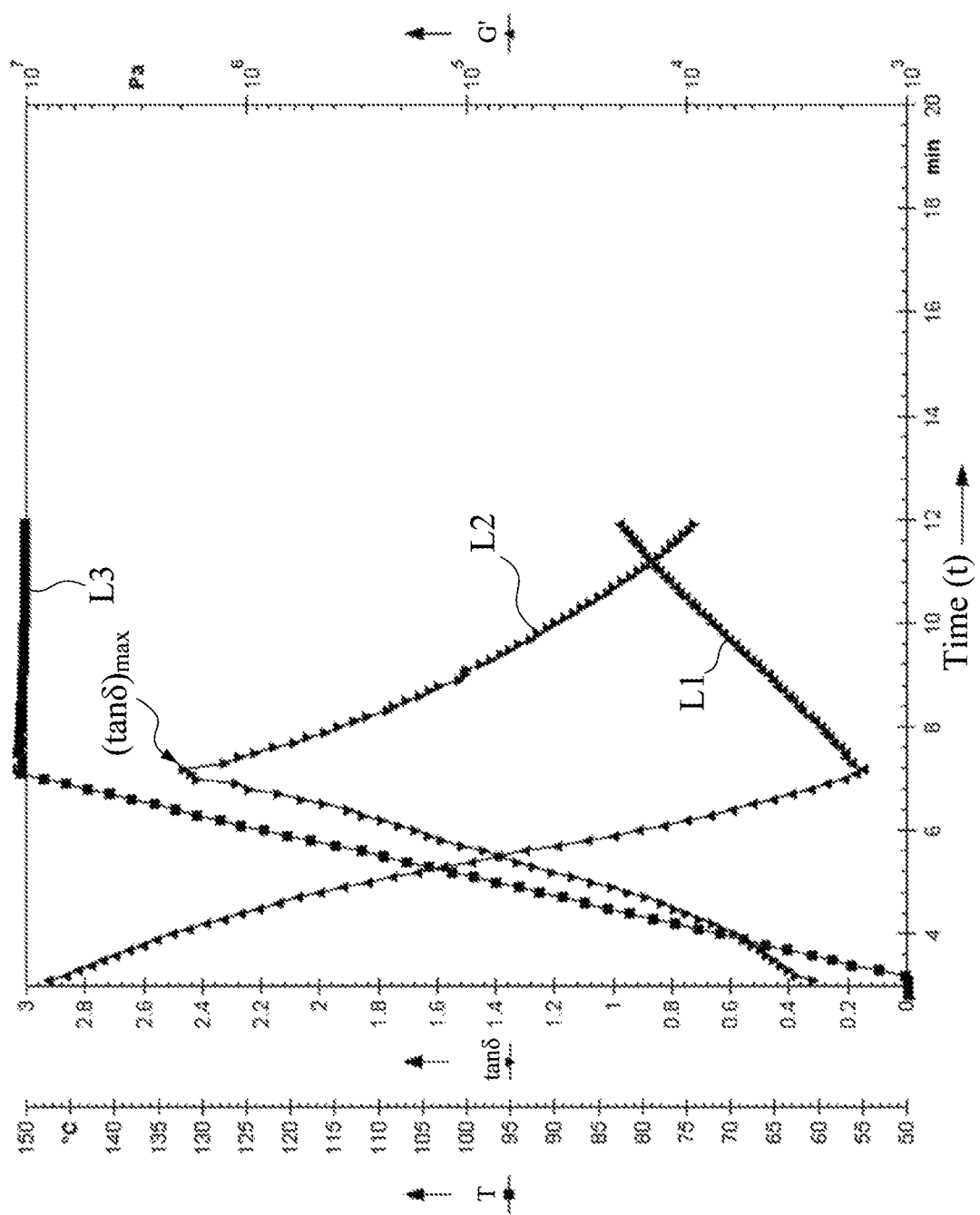
FIGS. 5A-5C are storage moduli (G')-to-time (t) and rheological loss factor (tan δ)-to-time (t) diagrams of a material of the light transmitting adhesive layer of FIG. 1 at different temperatures (T)
Figure 5B:
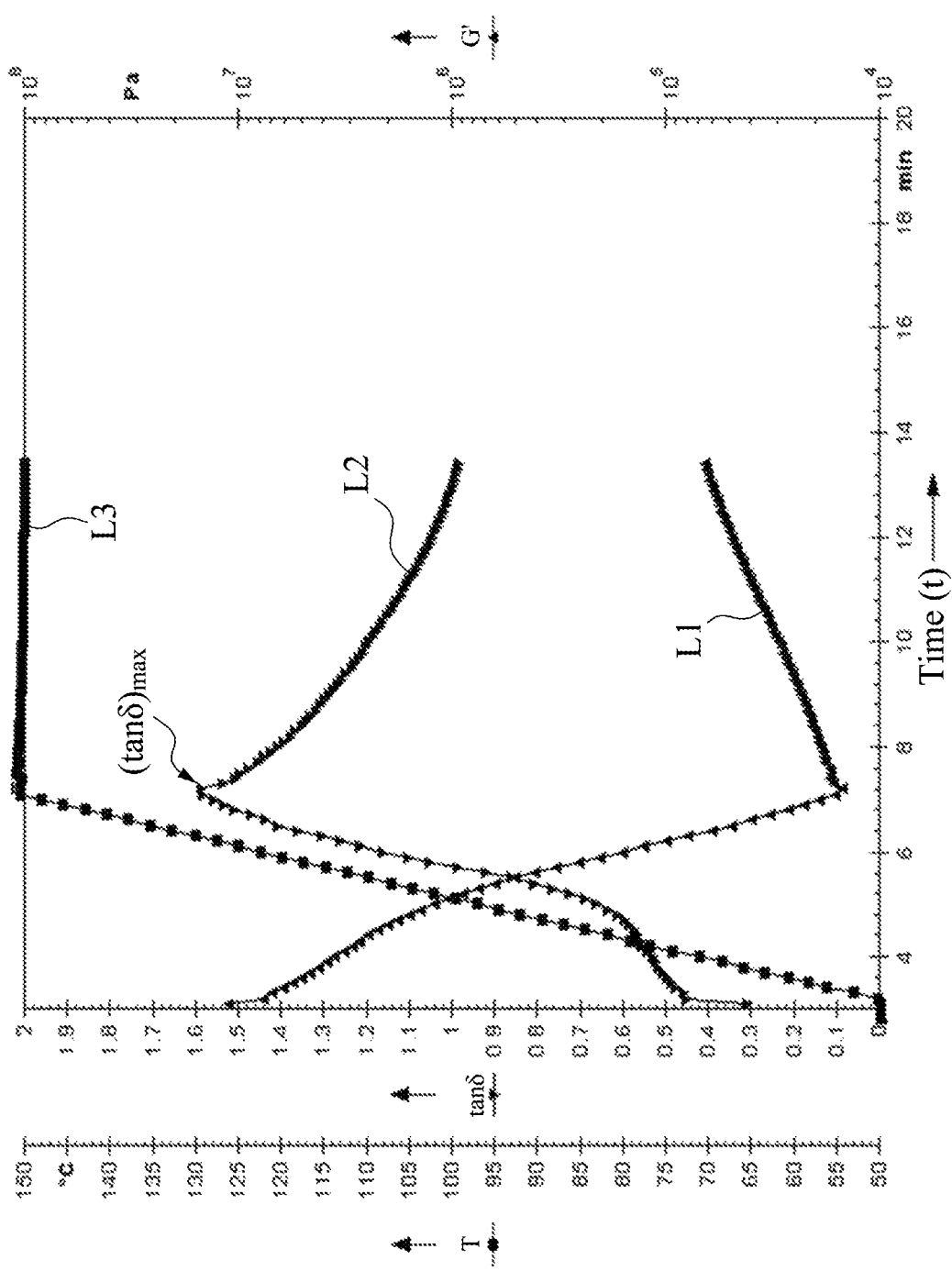
Figure 5C:
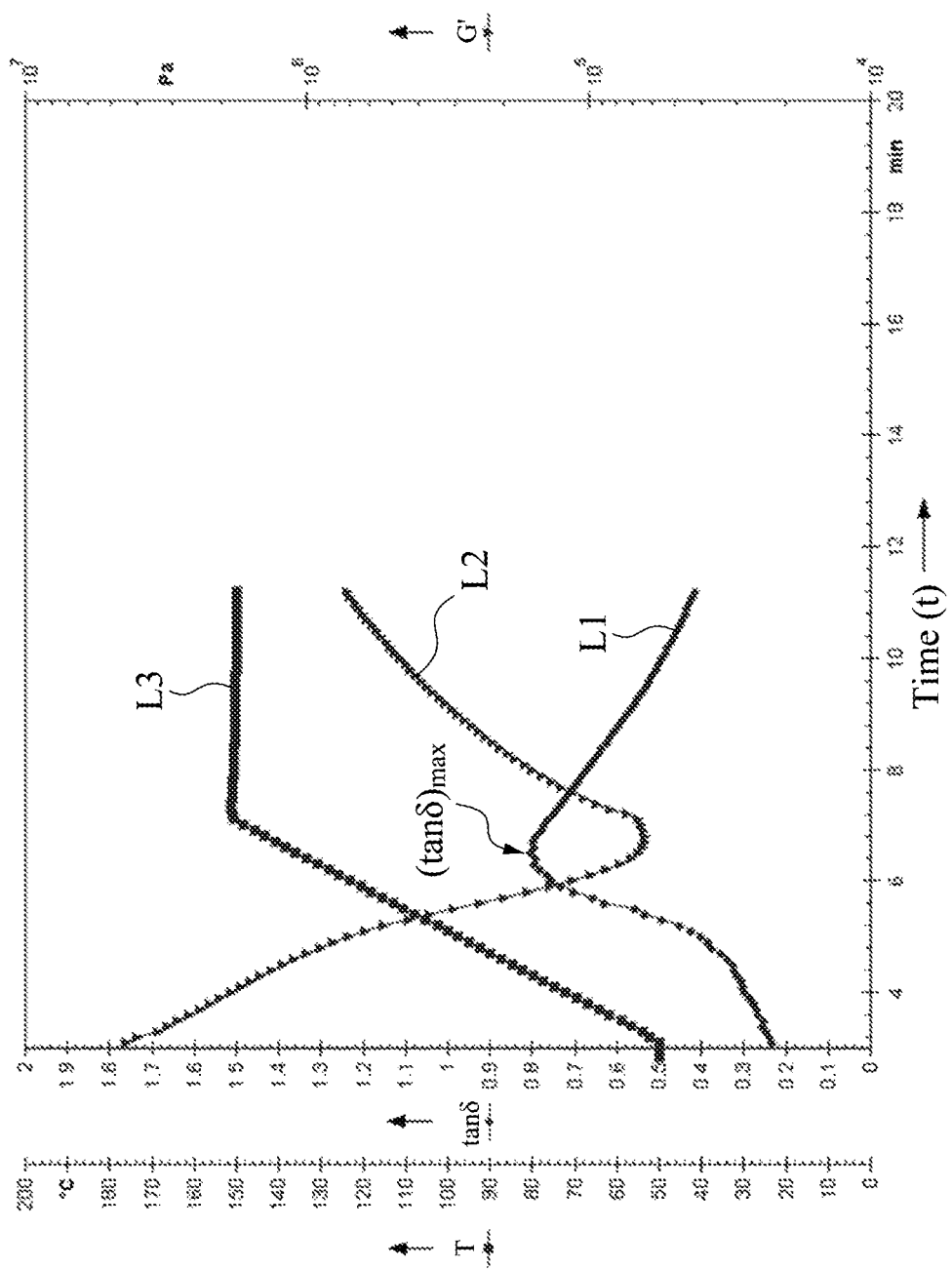

Before discussing each of the steps in detail, reference is made to FIGS. 5A-5C. FIGS. 5A-5C are storage moduli (G')-to-time (t) and rheological loss factor (tan δ)-to-time (t) diagrams of a material of the light transmitting adhesive layer 110 of FIG. 1 at different temperatures (T). It is noted that the material of the light transmissive adhesive layer 110 is in different states at different temperatures T, and the physical properties (e.g., fluidity) of the material of the light transmissive adhesive layer 110 can be determined by the storage moduli G' and the loss moduli G". The storage modulus G' can represent the elasticity of a material, and the loss moduli G" can represent the viscosity of a material. In addition, a ratio G"/G' of the loss moduli G" to the storage moduli G' is the rheological loss factor tan δ, which can represent the rheological property (or the deformation) of a material.

As shown in FIGS. 5A-5C, a curve L1 represents the storage moduli G' of the material of the light transmissive adhesive layer 110 of the present disclosure, a curve L2 represents the rheological loss factor tan δ of the material of the light transmissive adhesive layer 110 of the present disclosure, and a curve L3 represents the temperature T of the material of the light transmissive adhesive layer 110 of the present disclosure. It should be understood that the values of the storage moduli G' and the rheological loss factor tan δ are the results measured by rheometer, and for the purpose of clarity, the loss moduli G" of the material of light transmissive adhesive layer 110 is omitted in FIGS. 5A-5C. In detail, as the temperature T gradually increases, the material of the light transmissive adhesive layer 110 may be gradually changed from a viscous state to a viscoelastic state (i.e., a semi-solid colloidal state), and subsequently changed from the semi-solid colloidal state to an elastic state. In FIGS. 5A-5C, as the temperature T is in a range from about 50° C. to about 150° C., the rheological loss factor tan δ of the material of the light transmissive adhesive layer 110 gradually increases (i.e., the curve L2 gradually rises) as the temperature T increases, and the material of the light transmissive adhesive layer 110 is in a fluid state with relatively large viscosity. As the temperature T increases to about 150° C., the maximum of the rheological loss factor (tan δ)$_{max}$ of the material of the light transmissive adhesive layer 110 is in a range from 0.5 to 2.5 (e.g., the maximum of the rheological loss factor (tan δ)$_{max}$ in FIG. 5A is 2.5, the maximum of the rheological loss factor (tan δ)$_{max}$ in FIG. 5B is 1.6, and the maximum of the rheological loss factor (tan δ)$_{max}$ in FIG. 5C is 0.8), and the material of the light transmissive adhesive layer 110 is in a semi-solid colloidal state with viscoelasticity. It is noted that when the maximum of the rheological loss factor (tan δ)$_{max}$ is in a range from 0.5 to 2.5, fluidity of the material of the light transmissive adhesive layer 110 can be appropriate, such that the light-emitting diode chip 130 can be effectively fixed. As the material of the light transmissive adhesive layer 110 is heated at a temperature of 150° C. for a period of time or above 150° C., the material of the light transmissive adhesive layer 110 is in a solid state with relatively large elasticity.

By utilizing the physical properties of the material of the light transmissive adhesive layer 110, the light-emitting diode chip 130 can be effectively fixed onto the substrate 120, such that a displacement of the light-emitting diode chip 130 will not obviously occur during the disposing of the light-emitting diode chip 130, and the climbing of the light transmissive adhesive layer 110 will not obviously occur (i.e., the height of the climbing of the light transmissive adhesive layer 110 is smaller than 20% of the height of the light-emitting diode chip 130 or no climbing) as the light-emitting diode chip 130 is disposed thereon. In the following descriptions, the method of manufacturing the light-emitting package structure 100 will be discussed in detail with reference to FIG. 5A.

FIG. 6 is schematic diagram of a process at step S10 of the method of manufacturing the light-emitting package structure 100 according to an embodiment of the present disclosure. In step S10, a light transmissive adhesive material 180 is formed on a carrier 190. Since the light transmissive adhesive material 180 is in a fluid state with relatively large viscosity, the light transmissive adhesive material 180 can be formed on a surface 191 of the carrier 190 by coating (e.g., spin coating, slit coating, etc.). In some embodiments, the carrier 190 may be made of a material including polyethylene terephthalate (PET). In some embodiments, filler particles 150 or a wavelength converting substance 170 may be selectively doped into the light transmissive adhesive material 180 before coating. For the purpose of clarity, only the filler particles 150 are illustrated in FIG. 6.

FIG. 7 is schematic diagram of a process at step S20 of the method of manufacturing the light-emitting package structure 100 according to an embodiment of the present disclosure. In step S20, pre-heating is performed such that the light transmissive adhesive material 180 is heated, and the light transmissive adhesive material 180 is gradually changed from a fluid state with relatively large viscosity to a semi-solid colloidal state with viscoelasticity to further form a film-shaped light transmissive adhesive material 180. Since the fluidity of the film-shaped light transmissive adhesive material 180 is relatively small, the light transmissive adhesive material 180 does not randomly flow on the carrier 190. In some embodiments, heating the light transmissive adhesive material 180 is performed at a maximum temperature in a range from about 110° C. to about 150° C. Reference is made to FIG. 5A. When the temperature in a range from about 110° C. to about 150° C., the maximum of the rheological loss factor (tan δ)$_{max}$ of the light transmissive adhesive material 180 is in a range from about 0.5 to about 2.5. This shows that the fluidity of the light transmissive adhesive material 180 is appropriate, such that subsequent steps are able to be performed.

Figure 8:
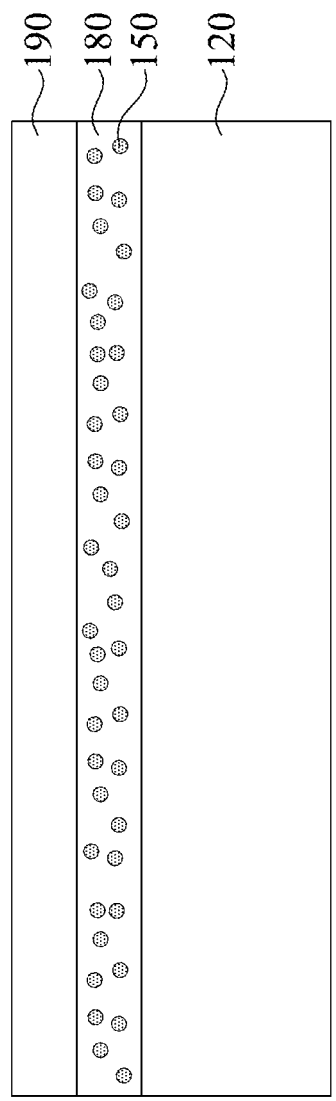

FIG. 8 is schematic diagram of a process at step S30 of the method of manufacturing the light-emitting package structure 100 according to an embodiment of the present disclosure. In step S30, the carrier 190 and the light transmissive adhesive material 180 on the carrier 190 are placed upside down on a substrate 120, such that the light transmissive adhesive material 180 is between the carrier 190 and the substrate 120, that is, the carrier 190 and the substrate 120 are respectively on opposite surfaces of the light transmissive adhesive material 180. Since the fluidity of the light transmissive adhesive material 180 is appropriate, the light transmissive adhesive material 180 does not overflow due to the inversion. Subsequently, the substrate 120, the carrier 190, and the light transmissive adhesive material 180 are heated and pressurized. By utilizing a difference between an adhesion force between the light transmissive adhesive material 180 and the carrier 190 and an adhesion force between the light transmissive adhesive material 180 and the substrate 120, the light transmissive adhesive material 180 is adhered to the substrate 120. In detail, since the carrier 190 is made of a material including polyethylene terephthalate, and an adhesion force between the light transmissive adhesive material 180 and the polyethylene terephthalate is weaker than the adhesion force between the light transmissive adhesive material 180 and the substrate 120, the light transmissive adhesive material 180 is easily detached from the carrier 190 and adhered to the substrate 120. In this step, heating is to maintain the appropriate fluidity of the light transmissive adhesive material 180 (i.e., maintain the semi-solid colloidal state of the light transmissive adhesive material 180), and pressurization is to facilitate the adhesion of the light transmissive adhesive material 180 to the substrate 120. In some embodiments, heating the substrate 120, the carrier 190, and the light transmissive adhesive material 180 is performed under a temperature of about 150° C. Reference is made to FIG. 5A. When the temperature T is at about 150° C., the maximum of the rheological loss factor (tan $\delta)_{max}$ of the light transmissive adhesive material 180 is in a range from about 0.5 to about 2.5. This show that the appropriate fluidity of the light transmissive adhesive material 180 is indeed to be maintained.

When the maximum of the rheological loss factor (tan $\delta)_{max}$ of the light transmissive adhesive material 180 is in a range from about 0.5 to about 2.5, the fluidity of the light transmissive adhesive material 180 is appropriate, that is, the deformation of the light transmissive adhesive material 180 is appropriate. As such, the light-emitting diode chip 130 can be effectively fixed onto the substrate 120, and hence the yield of the light-emitting package structure 100 is improved. In detail, if the maximum of the rheological loss factor (tan $\delta)_{max}$ of the light transmissive adhesive material 180 is larger than 2.5, the fluidity of the light transmissive adhesive material 180 is too large, such that the position of the light-emitting diode chip 130 may easily be shifted; if the maximum of the rheological loss factor (tan $\delta)_{max}$ of the light transmissive adhesive material 180 is smaller than 0.5, the deformation of the light transmissive adhesive material 180 is too small, such that the light-emitting diode chip 130 is unable to be effectively fixed onto the substrate 120.

Figure 9:
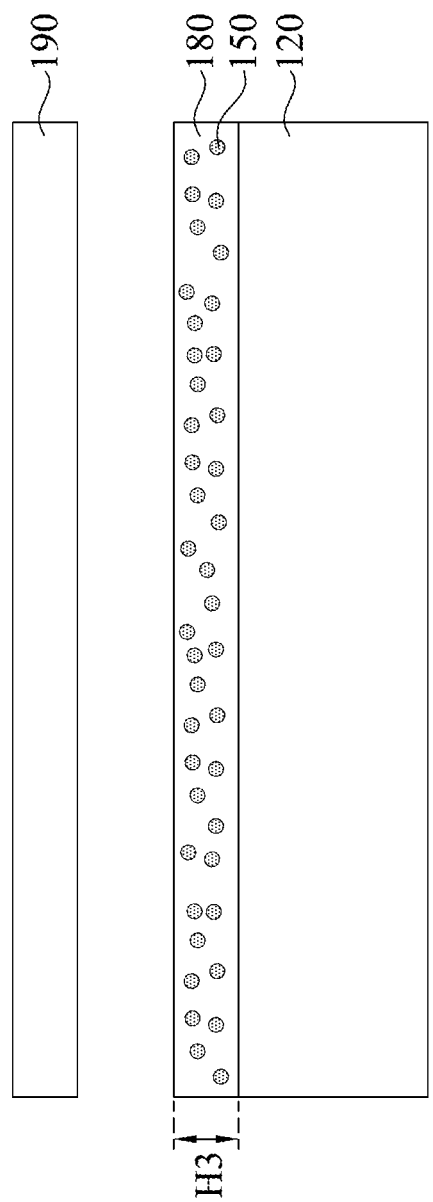

FIG. 9 is schematic diagram of a process at step S30 of the method of manufacturing the light-emitting package structure 100 according to an embodiment of the present disclosure. Step S30 is continuously performed. After heating and pressurizing the substrate 120, the carrier 190, and the light transmissive adhesive material 180, the carrier 190 is removed, such that the light transmissive adhesive material 180 is detached from the carrier 190 and transferred onto the substrate 120. A thickness H3 of the light transmissive adhesive material 180 transferred onto the substrate 120 is in a range from about 5 µm to about 50 µm. Such a thickness range of the light transmissive adhesive material 180 makes a light-emitting diode chip 130 subsequently disposed relatively stable. In detail, if the thickness H3 of the light transmissive adhesive material 180 is smaller than 5 µm, the light-emitting diode chip 130 easily penetrates through the light transmissive adhesive material 180 to be in contact with the substrate 120; if the thickness H3 of the light transmissive adhesive material 180 is larger than 50 µm, the light-emitting diode chip 130 is easily detached due to the large thickness of the light transmissive adhesive material 180.

Figure 10:
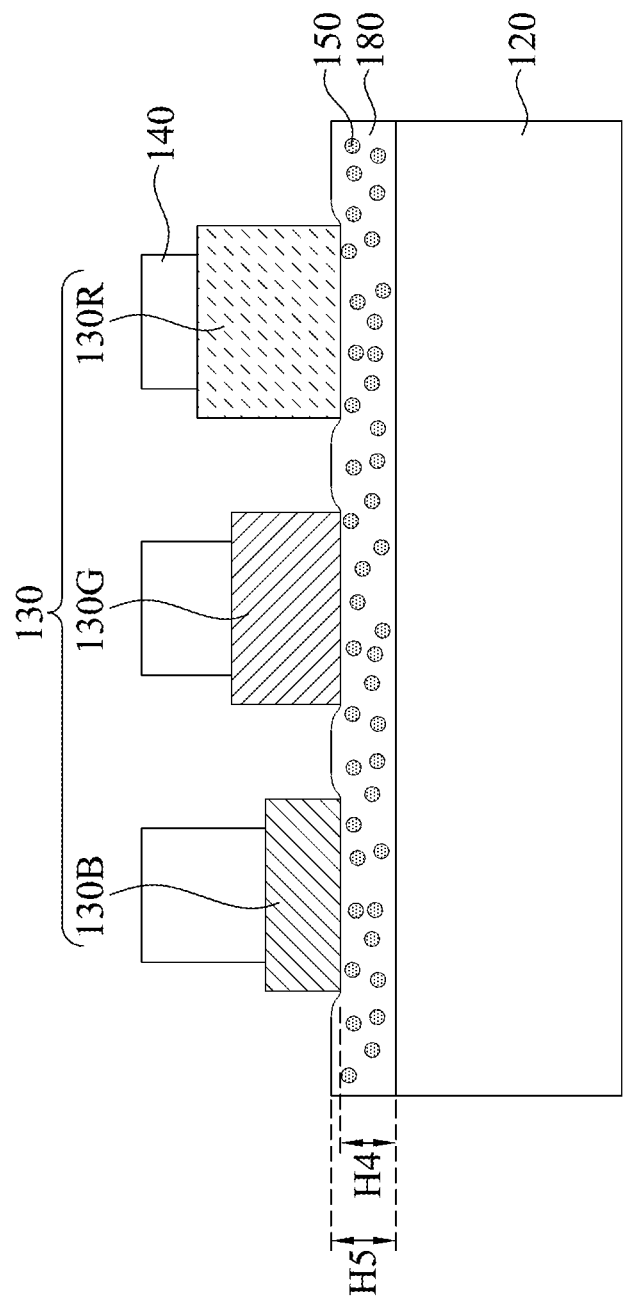

FIG. 10 is schematic diagram of a process at step S40 of the method of manufacturing the light-emitting package structure 100 according to an embodiment of the present disclosure. In step S40, at least one light-emitting diode chip 130 is disposed on the light transmissive adhesive material 180. In some embodiments, a red light-emitting diode chip 130R, a green light-emitting diode chip 130G, and a blue light-emitting diode chip 130B may be disposed adjacent to each other. In other embodiments, the light-emitting diode chips 130 of the same color can be disposed adjacent to each other. Since the fluidity of the light transmissive adhesive material 180 is appropriate, the climbing of the light transmissive adhesive material 180 will not obviously occur as the light-emitting diode chip 130 is being disposed thereon, and a displacement of the light-emitting diode chip 130 will not obviously occur during the disposing of the light-emitting diode chip 130, neither. In some embodiments, the light-emitting diode chip 130 may cause the light transmissive adhesive material 180 to be slightly recessed, such that a thickness H4 of the recessed portion of the light transmissive adhesive material 180 is smaller than a thickness H5 of the surrounding un-recessed portion of the light transmissive adhesive material 180. In another embodiment, the disposing of light-emitting diode chip 130 does not cause the light transmissive adhesive material 180 to be slightly recessed, such that the thickness of the light transmissive adhesive material 180 is uniform. In other embodiments, the disposing of light-emitting diode chip 130 causes a slight climbing of the transmissive adhesive material 180 along the light-emitting diode chip 130, however, since the fluidity of the light transmissive adhesive material 180 is appropriate, the height of the climbing of the light transmissive adhesive material 180 is smaller than 20% of the height of the light-emitting diode chip 130.

Figure 11:
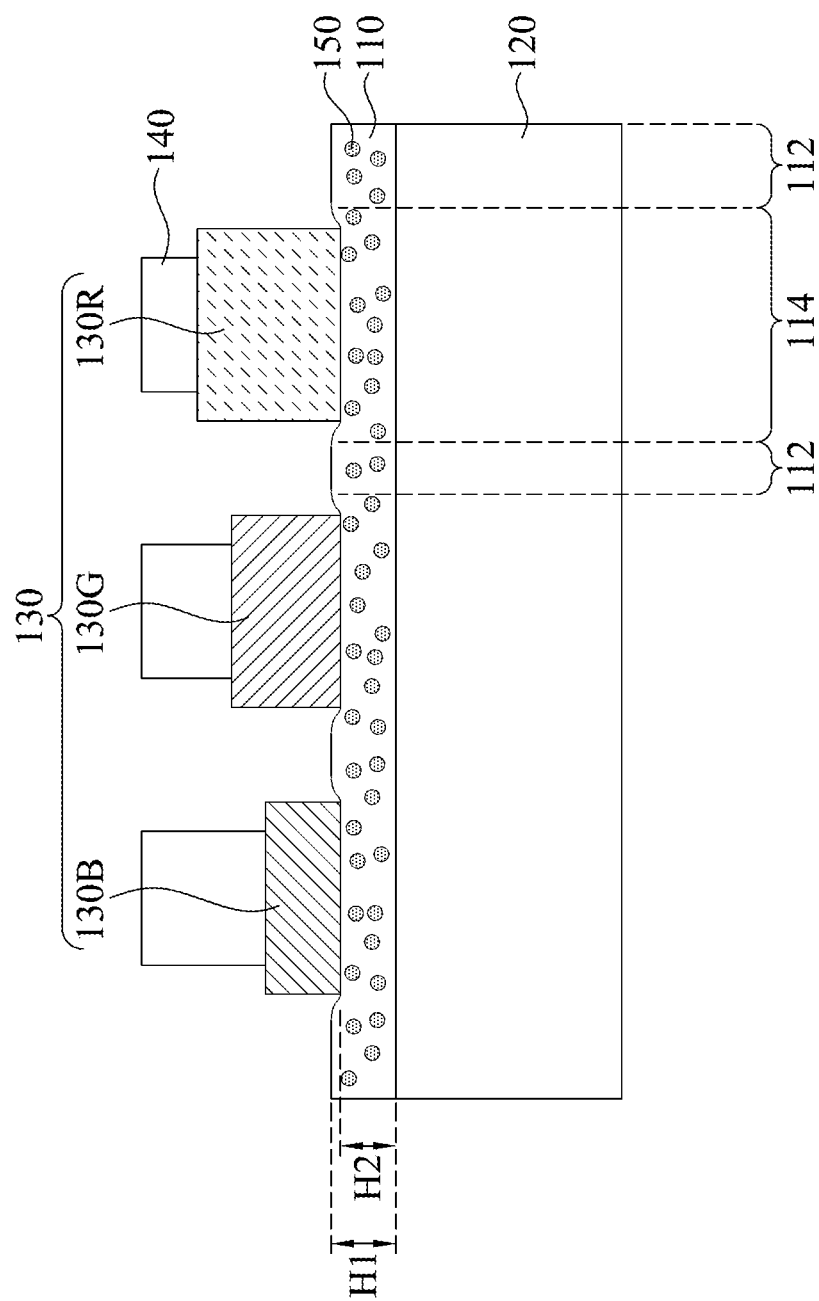

FIG. 11 is schematic diagram of a process at step S50 of the method of manufacturing the light-emitting package structure 100 according to an embodiment of the present disclosure. In step S50, post-heating is performed such that the light transmissive adhesive material 180 is heated and gradually changed from the colloidal state to a solid state to form as a light transmissive adhesive layer 110. In detail, the light transmissive adhesive material 180 of the colloidal state gradually turns into the solid state as being heated. Through the aforementioned transformation, the light-emitting diode chip 130 can be stably fixed onto the light transmissive adhesive layer 110. In some embodiments, heating the light transmissive adhesive material 180 is performed under a temperature in a range from about 80° C. to about 160° C. Reference is made to FIG. 5A. Specifically, when the temperature T is in a range from about 80° C. to about 150° C., the maximum of the rheological loss factor (tan $\delta)_{max}$ of the light transmissive adhesive material 180 is in a range from about 0.5 to about 2.5, and the material is still in the colloidal state, however, as the heating time is elongated, the light transmissive adhesive layer 110 of the solid state can be finally obtained; when the temperature T is continuously maintain at about 150° C. (or the temperature T is in a range from about 150° C. to about 160° C.), the rheological loss factor tan δ of the light transmissive adhesive material 180 will decrease in a short period of time, that is, the light transmissive adhesive material 180 of the colloidal state can be converted into the light transmissive adhesive layer 110 of the solid state in a short period of time.

Reference is made to FIGS. 10 and 11. It is noted that if the light transmissive adhesive material 180 is caused to be slightly recessed during the disposing of the light-emitting diode chip 130 in step S40, the light transmissive adhesive layer 110 formed in step S50 has a first portion 112 and a second portion 114, a thickness H2 of the second portion 114 is smaller than a thickness H1 of the first portion 112, and the first portion 112 surrounds portions of the light-emitting diode chip 130; if the light transmissive adhesive material 180 is not caused to be slightly recessed during the disposing of the light-emitting diode chip 130 in step S40, the light transmissive adhesive layer 110 formed in step S50 has a uniform thickness.

According to the embodiments of the present disclosure, during the manufacturing process of the light-emitting package structure, the light transmissive adhesive material is first heated to be in a semi-solid colloidal state, and since the maximum of the rheological loss factor (tan $\delta$)$_{max}$ of the light transmissive adhesive material is in a range from 0.5 to 2.5, fluidity of the light transmissive adhesive material can be appropriate. As such, the climbing of the light transmissive adhesive material will not obviously occur as the light-emitting diode chip is being disposed thereon, and a displacement of the light-emitting diode chip will not obviously occur during the disposing of the light-emitting diode chip, neither. Therefore, the light-emitting diode chip is effectively fixed onto the substrate through the subsequently formed light transmissive adhesive layer, and hence the yield of the light-emitting package structure is improved. Furthermore, the light transmissive adhesive layer of the light-emitting package structure formed by the aforementioned manufacturing method may have the first portion and the second portion surrounded by the first portion, in which the light-emitting diode chip is disposed on the second portion, and the thickness of the second portion is smaller than or equal to the thickness of the first portion.

Although the present disclosure has been described in considerable detail with reference to certain embodiments thereof, other embodiments are possible. Therefore, the spirit and scope of the appended claims should not be limited to the description of the embodiments contained herein.

It will be apparent to those skilled in the art that various modifications and variations can be made to the structure of the present disclosure without departing from the scope or spirit of the disclosure. In view of the foregoing, it is intended that the present disclosure covers modifications and variations of this disclosure provided they fall within the scope of the following claims.

What is claimed is:

1. A light-emitting package structure, comprising:
    a light transmissive adhesive layer having a first surface and a second surface facing away from the first surface;
    a substrate on the first surface of the light transmissive adhesive layer; and
    at least one light-emitting diode chip on the second surface of the light transmissive adhesive layer, wherein the light-emitting diode chip emits blue light, the light transmissive adhesive layer has a first portion and a second portion on the second surface, the first portion surrounds the second portion, a vertical projection area of the second portion on the substrate at least entirely covers a vertical projection area of the light-emitting diode chip on the substrate, a thickness of the second portion is smaller than or equal to a thickness of the first portion, an oblique surface is between the second surface of the first portion and the second surface of the second portion, and the oblique surface gradually extends away the substrate from the second surface of the second portion to the second surface of the first portion; and
    a wavelength converting substance in the light transmissive adhesive layer, wherein the wavelength converting substance absorbs portions of the blue light and converts to corresponding color light.

2. The light-emitting package structure of claim 1, wherein the oblique surface gradually extends away the light emitting-diode chip from the second surface of the second portion to the second surface of the first portion.

3. The light-emitting package structure of claim 1, wherein a height of a climbing of the first portion of the light transmissive adhesive layer is smaller than 20% of a height of the light-emitting diode chip.

4. The light-emitting package structure of claim 1, wherein a number of the light-emitting diode chip is plural.

5. The light-emitting package structure of claim 4, wherein the light-emitting diode chip comprises a red light-emitting diode chip, a green light-emitting diode chip or a blue light-emitting diode chip.

6. The light-emitting package structure of claim 1, further comprising a plurality of filler particles in the light transmissive adhesive layer, wherein the filler particles are configured to adjust a path of light emitted by the light-emitting diode chip.

7. The light-emitting package structure of claim 1, wherein the substrate is a light transmissive substrate.

8. The light-emitting package structure of claim 1, further comprising an encapsulation layer on the second surface of the light transmissive adhesive layer and covering the light-emitting diode chip.

* * * * *